(12) United States Patent
Baldwin et al.

(10) Patent No.: US 10,025,183 B2
(45) Date of Patent: Jul. 17, 2018

(54) PHOTOSENSITIVE RESIN COMPOSITION

(71) Applicant: MacDermid Graphics Solutions, LLC, Waterbury, CT (US)

(72) Inventors: Kyle P. Baldwin, Acworth, GA (US); Miguel A. Barboza, Fairburn, GA (US); Kerry O'Brate, Decatur, GA (US); Rogelio Sanchez, Fairburn, GA (US)

(*) Notice: Subject to any disclaimer, the term of this patent is extended or adjusted under 35 U.S.C. 154(b) by 602 days.

(21) Appl. No.: 14/160,799

(22) Filed: Jan. 22, 2014

(65) Prior Publication Data

US 2015/0205199 A1 Jul. 23, 2015

(51) Int. Cl.
| | |
|---|---|
| G02F 7/00 | (2006.01) |
| G03F 7/027 | (2006.01) |
| G03F 7/029 | (2006.01) |
| G03F 7/031 | (2006.01) |
| G03F 7/20 | (2006.01) |

(52) U.S. Cl.
CPC .............. *G03F 7/027* (2013.01); *G03F 7/029* (2013.01); *G03F 7/031* (2013.01); *G03F 7/202* (2013.01)

(58) Field of Classification Search
USPC .......................................................... 430/306
See application file for complete search history.

(56) References Cited

U.S. PATENT DOCUMENTS

| | | | |
|---|---|---|---|
| 3,265,765 A | 8/1966 | Holden et al. | |
| 3,867,153 A | 2/1975 | MacLachlan | |
| 4,264,705 A | 4/1981 | Allen | |
| 4,320,188 A | 3/1982 | Heinz et al. | |
| 4,323,636 A | 4/1982 | Chen | |
| 4,323,637 A | 4/1982 | Chen et al. | |
| 4,369,246 A | 1/1983 | Chen et al. | |
| 4,423,135 A | 12/1983 | Chen et al. | |
| 4,427,759 A | 1/1984 | Gruetzmacher et al. | |
| 4,622,088 A | 11/1986 | Min | |
| 5,135,827 A | 8/1992 | Bohm et al. | |

(Continued)

FOREIGN PATENT DOCUMENTS

| | | |
|---|---|---|
| EP | 0 456 336 | 11/1991 |
| EP | 0 640 878 | 3/1995 |

(Continued)

*Primary Examiner* — Chanceity N Robinson
(74) *Attorney, Agent, or Firm* — Carmody Torrance Sandak & Hennessey LLP

(57) ABSTRACT

A photosensitive printing blank having is described. The photosensitive printing blank comprises at least one photocurable layer that is capable of being selectively crosslinked and cured upon exposure to actinic radiation at a desired wavelength region comprising (a) at least one elastomeric binder, (b) at least one ethylenically unsaturated monomer, (c) a photoinitiator having a favorable absorption profile in the desired wavelength region used for exposing the at least one photocurable layer to actinic radiation, and (d) a dye, wherein the dye exhibits a suitable percent transmission as measured with a UV spectrophotometer at the desired wavelength region used for exposing the at least one photocurable layer to actinic radiation, and optionally an infrared ablatable layer disposed on the at least one photocurable layer. A method of making a relief image printing element from the photosensitive printing blank is also described.

9 Claims, 2 Drawing Sheets

(56) References Cited

U.S. PATENT DOCUMENTS

| | | |
|---|---|---|
| 5,223,375 A | 6/1993 | Berrier et al. |
| 5,262,275 A | 11/1993 | Fan |
| 5,457,007 A | 10/1995 | Asami |
| 5,474,875 A | 12/1995 | Loerzer et al. |
| 5,496,685 A | 3/1996 | Farber et al. |
| 5,853,958 A | 12/1998 | Cheng et al. |
| 5,922,508 A | 7/1999 | Zertani et al. |
| 5,925,500 A | 7/1999 | Yang |
| 6,030,749 A | 2/2000 | Takahashi |
| 6,238,837 B1 | 5/2001 | Fan |
| 6,245,486 B1 * | 6/2001 | Teng ............................. 430/303 |
| 7,749,683 B2 | 7/2010 | Williamson |
| 8,530,117 B2 | 9/2013 | Ali et al. |
| 2003/0219681 A1 | 11/2003 | Cheng et al. |
| 2008/0257185 A1 | 10/2008 | Becker et al. |
| 2009/0075199 A1 | 3/2009 | Lungu |
| 2012/0129968 A1 | 5/2012 | Bishop |
| 2012/0219773 A1 | 8/2012 | Zwadlo et al. |
| 2013/0059089 A1 * | 3/2013 | Gullentops et al. .......... 427/510 |
| 2013/0242276 A1 | 9/2013 | Schadebrodt et al. |

FOREIGN PATENT DOCUMENTS

| | | |
|---|---|---|
| EP | 1107063 | 6/2001 |
| EP | 1 472 097 | 9/2007 |
| GB | 1 366 769 | 9/1974 |
| JP | 05273752 | 10/1993 |
| JP | 2004-233799 | 8/2004 |
| JP | 2013534324 | 9/2013 |

* cited by examiner

PHOTOSENSITIVE RESIN COMPOSITION

FIELD OF THE INVENTION

The present invention relates generally to a method of making a flexographic printing element having improved exposure latitude.

BACKGROUND OF THE INVENTION

Flexography is a method of printing that is commonly used for high-volume runs. Flexography is employed for printing on a variety of substrates such as paper, paperboard stock, corrugated board, films, foils and laminates. Newspapers and grocery bags are prominent examples. Coarse surfaces and stretch films can be economically printed only by means of flexography.

Flexographic printing plates are relief plates with image elements raised above open areas. Generally, the plate is somewhat soft, and flexible enough to wrap around a printing cylinder, and durable enough to print over a million copies. Such plates offer a number of advantages to the printer, based chiefly on their durability and the ease with which they can be made. A typical flexographic printing plate as delivered by its manufacturer is a multilayered article made of, in order, a backing or support layer; one or more unexposed photocurable layers; optionally a protective layer or slip film; and often, a protective cover sheet.

The support (or backing) layer lends support to the plate. The support layer can be formed from a transparent or opaque material such as paper, cellulose film, plastic, or metal. Preferred materials include sheets made from synthetic polymeric materials such as polyesters, polystyrene, polyolefin, polyamides, and the like, including polyethylene terephthalate (PET), polyethylene naphthalate (PEN), and polybutylene terephthalate (PBT). The support may be in sheet form or in cylindrical form, such as a sleeve. The sleeve may be formed from single layer or multiple layers of flexible material. Flexible sleeves made of polymeric films are preferred, as they typically are transparent to ultraviolet radiation and thereby accommodate backflash exposure for building a floor in the cylindrical printing element. One widely used support layer is a flexible film of polyethylene terephthalate.

The photocurable layer(s) can include any of the known photopolymers, monomers, initiators, reactive or non-reactive diluents, fillers, processing aids, UV absorbers and dyes. As used herein, the term "photocurable" refers to a composition which undergoes polymerization, cross-linking, or any other curing or hardening reaction in response to actinic radiation with the result that the unexposed portions of the material can be selectively separated and removed from the exposed (cured) portions to form a three-dimensional relief pattern of cured material. Exemplary photocurable materials are disclosed in European Patent Application Nos. 0 456 336 A2 and 0 640 878 A1 to Goss, et al., British Patent No. 1,366,769, U.S. Pat. No. 5,223,375 to Berrier, et al., U.S. Pat. No. 3,867,153 to MacLahan, U.S. Pat. No. 4,264,705 to Allen, U.S. Pat. Nos. 4,323,636, 4,323,637, 4,369,246, and 4,423,135 all to Chen, et al., U.S. Pat. No. 3,265,765 to Holden, et al., U.S. Pat. No. 4,320,188 to Heinz, et al., U.S. Pat. No. 4,427,759 to Gruetzmacher, et al., U.S. Pat. No. 4,622,088 to Min, and U.S. Pat. No. 5,135,827 to Bohm, et al., the subject matter of each of which is herein incorporated by reference in its entirety. More than one photocurable layer may also be used. The photocurable layer(s) may be applied directly on the support. In the alternative, the photocurable layer(s) may be applied on top of an adhesion layer and/or resilient under layer.

Photocurable materials generally cross-link (cure) and harden through radical polymerization in at least some actinic wavelength region. As used herein, "actinic radiation" is radiation that is capable of polymerizing, crosslinking or curing the photocurable layer. Actinic radiation includes, for example, amplified (e.g., laser) and non-amplified light, particularly in the UV and violet wavelength regions.

The slip film is a thin layer, which protects the photopolymer from dust and increases its ease of handling. In a conventional ("analog") plate making process, the slip film is transparent to UV light, and the printer peels the cover sheet off the printing plate blank, and places a negative on top of the slip film layer. The plate and negative are then subjected to flood-exposure by UV light through the negative. The areas exposed to the light cure, or harden, and the unexposed areas are removed (developed) to create the relief image on the printing plate. In the alternative, a negative may be placed directly on the at least one photocurable layer.

In a "digital" or "direct to plate" process, a laser is guided by an image stored in an electronic data file, and is used to create an in situ negative in a digital (i.e., laser ablatable) masking layer, which is generally a slip film which has been modified to include a radiation opaque material. Portions of the laser ablatable layer are then ablated by exposing the masking layer to laser radiation at a selected wavelength and power of the laser. Thereafter, the at least one photocurable layer with the in situ negative thereon, is subjected to flood-exposure by UV light through the in situ negative. The areas exposed to the light cure, or harden, and the unexposed areas are removed (developed) to create the relief image on the printing plate. Selective exposure to the source of actinic radiation can be achieved using either the analog or digital method. Examples of laser ablatable layers are disclosed, for example, in U.S. Pat. No. 5,925,500 to Yang, et al., and U.S. Pat. Nos. 5,262,275 and 6,238,837 to Fan, the subject matter of each of which is herein incorporated by reference in its entirety.

Processing steps for forming relief image printing elements typically include the following:

1) Image generation, which may be mask ablation for digital "computer to plate" printing plates or negative production for conventional analog plates;
2) Face exposure through the mask (or negative) to selectively crosslink and cure portions of the photocurable layer not covered by the mask, thereby creating the relief image;
3) Back exposure to create a floor layer in the photocurable layer and establish the depth of relief. It is preferred to face expose the plate before flipping it for back exposure. Doing the back exposure first may result in damaging the black mask during the plate handling, thus contributing to image degradation. Some exposing systems can also run both exposure systems simultaneously, which also preserves the image integrity;
4) Development to remove unexposed photopolymer by solvent (including water) or dry "thermal" development; and
5) If necessary, post exposure and detackification.

Removable coversheets may be provided to protect the photocurable printing element from damage during transport and handling. Useful cover sheets include flexible polymeric films, e.g., polystyrene, polyethylene, polypropylene, polycarbonate, fluoropolymers, polyamide or polyesters. Polyesters, especially polyethylene terephthalate, are commonly used.

Prior to processing the printing elements, the coversheet(s) are removed and the photosensitive surface is exposed to actinic radiation in an imagewise fashion. Upon imagewise exposure to actinic radiation, polymerization, and hence, insolubilization of the photopolymerizable layer occurs in the exposed areas. Treatment with a suitable developer solvent (or thermal development) removes the unexposed areas of the photopolymerizable layer, leaving a printing relief that can be used for flexographic printing.

As used herein "back exposure" refers to a blanket exposure to actinic radiation of the photopolymerizable layer on the side opposite that which does, or ultimately will, bear the relief. This step is typically accomplished through a transparent support layer and is used to create a shallow layer of photocured material, i.e., the "floor," on the support side of the photocurable layer. The purpose of the floor is generally to sensitize the photocurable layer and to establish the depth of relief.

Prior to the brief back exposure step (i.e., brief as compared to the imagewise exposure step), an imagewise exposure is performed utilizing a digitally-imaged mask or a photographic negative mask, which is in contact with the photocurable layer and through which actinic radiation is directed.

The type of radiation used is dependent in part on the type of photoinitiator in the photopolymerizable layer. The digitally-imaged mask or photographic negative prevents the material beneath from being exposed to the actinic radiation and hence those areas covered by the mask do not polymerize, while the areas not covered by the mask are exposed to actinic radiation and polymerize. Any conventional sources of actinic radiation can be used for this exposure step. Examples of suitable visible and UV sources include carbon arcs, mercury-vapor arcs, fluorescent lamps, electron flash units, electron beam units, photographic flood lamps, and, more recently, light emitting diodes (LEDs), which emit UV light.

The use of ultraviolet mercury arc lamps that emit ultraviolet light suitable to cure photocurable layers is well known. Ultraviolet arc lamps emit light by using an electric arc to excite mercury that resides inside an inert gas (e.g., argon) environment to generate ultraviolet light which effectuates curing. Alternatively, microwave energy can also be used to excite mercury lamps in an inert gas medium to generate the ultraviolet light. However, the use of ultraviolet mercury lamps as a radiation source suffers from several disadvantages including environmental concerns from mercury and the generation of ozone as a by-product. Further, mercury lamps typically have lower energy conversion ratio, require warm-up time, generate heat during operation, and consume a large amount of energy when compared with LEDs. In addition, mercury lamps are characterized by a broad spectral output, in addition to the UV radiation, much of which is not useful for curing and can damage substrates and presents hazards to personnel.

LEDs are semiconductor devices which use the phenomenon of electroluminescence to generate light. LEDs consist of a semiconducting material doped with impurities to create a p-n junction capable of emitting light as positive holes join with negative electrons when voltage is applied. The wavelength of emitted light is determined by the materials used in the active region of the semiconductor. Typical materials used in semiconductors of LEDs include, for example, elements from Groups (III) and (V) of the periodic table. These semiconductors are referred to as III-V semiconductors and include, for example, GaAs, GaP, GaAsP, AlGaAs, InGaAsP, AlGaInP and InGaN semiconductors. The choice of materials is based on multiple factors including desired wavelength of emission, performance parameters and cost.

It is possible to create LEDs that emit light anywhere from a low of about 100 nm to a high of about 900 nm. Currently, known LED UV light sources emit light at wavelengths between about 300 and about 475 nm, with 365 nm, 390 nm and 395 nm being common peak spectral outputs. When using LED lamps for curing photocurable compositions, the photoinitiator is the coating composition is selected to be responsive to the wavelength of light emitted by the LED lamp.

LED offer several advantages over mercury lamps in curing applications. For example, LEDs do not use mercury to generate UV light and are typically less bulky than mercury UV arc lamps. In addition, LEDs are instant on/off sources requiring no warm-up time, which contributes to LED lamps' low energy consumption. LEDs also generate much less heat, with higher energy conversion efficiency, have longer lamp lifetimes, and are essentially monochromatic emitting a desired wavelength of light which is governed by the choice of semiconductor materials employed in the LED.

In the analog flexographic printing element world, higher UV doses are often required to hold finer highlight dots. If a desired dot level would not hold, then the operator would increase the dose by increasing the amount of time that the plate was exposed. This would work for most plate formulation types. However, the downside is that as exposure times are increased to hold finer dots, reverses often start to close up. This is commonly referred to as the plate's exposure latitude." Therefore, one can increase the dot sensitivity only to the point where the reverses stay open. Thus, there remains a need in the art for an improved photocurable composition that can be imagewise exposed to actinic radiation from an LED source at a chosen wavelength while exhibiting a good exposure latitude.

SUMMARY OF THE INVENTION

It is an object of the present invention to provide a photocurable composition that exhibits good exposure latitude.

It is another object of the present invention to provide a photocurable resin composition that can be exposed to actinic radiation from an LED source at a chosen wavelength while exhibiting good exposure latitude.

It is still another object of the present invention to provide a photocurable resin composition that achieves fine highlight dots while not filling plate reverses.

To that end, in one embodiment, the present invention relates generally to a photosensitive printing blank having improved exposure latitude, the photosensitive printing blank comprising:
  a) a support;
  b) at least one photocurable layer disposed on the support wherein the at least one photocurable layer is capable of being selectively crosslinked and cured upon exposure to actinic radiation at a desired wavelength region, the at least one photocurable layer comprising:
    1) at least one elastomeric binder;
    2) at least one ethylenically unsaturated monomer;

3) a photoinitiator having a favorable absorption profile in the desired wavelength region used for exposing the at least one photocurable layer to actinic radiation;
4) a dye, wherein the dye exhibits a suitable percent transmission as measured with a UV spectrophotometer at the desired wavelength region used for exposing the at least one photocurable layer to actinic radiation; and c) optionally, a laser ablatable mask layer disposed upon the at least one photocurable layer.

In another embodiment, the present invention relates generally to a method of making a photosensitive relief image printing element from a photosensitive printing blank, wherein the photosensitive printing blank comprises a support, at least one photocurable layer upon the support, wherein the at least one photocurable layer is capable of being selectively crosslinked and cured upon exposure to actinic radiation at a desired wavelength region and wherein the at least one photocurable layer comprises (a) at least one elastomeric binder, (b) at least one ethylenically unsaturated monomer, (c) a photoinitiator having a favorable absorption profile in the desired wavelength region used for exposing the at least one photocurable layer to actinic radiation, and (d) a dye, wherein the dye exhibits a suitable percent transmission as measured with a UV spectrophotometer at the desired wavelength region used for exposing the at least one photocurable layer to actinic radiation, and optionally an infrared ablatable layer disposed on the at least one photocurable layer; the method comprising the steps of:

a) imagewise exposing the at least one photocurable layer to actinic radiation at the desired wavelength region to selectively cross link and cure the at least one photocurable layer; and
b) developing the photocurable layer to remove uncured portions of the at least one photocurable layer;
wherein the presence of the dye exhibiting a suitable percent transmission at the desired wavelength region used for exposure of the least one photocurable layer to actinic radiation results in a relief image in the printing element having improved exposure latitude.

DETAILED DESCRIPTION OF THE PREFERRED EMBODIMENTS

The present invention relates generally to a method of making a photosensitive relief image printing element from a photosensitive printing blank, wherein the photosensitive printing blank comprises a support, at least one photocurable layer upon the support, wherein the at least one photocurable layer is capable of being selectively crosslinked and cured upon exposure to actinic radiation at a desired wavelength region and wherein the at least one photocurable layer comprises (a) at least one elastomeric binder, (b) at least one ethylenically unsaturated monomer, (c) a photoinitiator having a favorable absorption profile in the desired wavelength region used for exposing the at least one photocurable layer to actinic radiation, and (d) a dye, wherein the dye exhibits a suitable percent transmission as measured with a UV spectrophotometer at the desired wavelength region used for exposing the at least one photocurable layer to actinic radiation, and optionally an infrared ablatable layer disposed on the at least one photocurable layer; the method comprising the steps of:

a) imagewise exposing the at least one photocurable layer to actinic radiation at the desired wavelength region to selectively cross link and cure the at least one photocurable layer; and
b) developing the photocurable layer to remove uncured portions of the at least one photocurable layer;
wherein the presence of the dye exhibiting a suitable percent transmission at the desired wavelength region used for exposure of the least one photocurable layer to actinic radiation results in a relief image in the printing element having an improved exposure latitude.

The present invention also describes the use of LEDs operating within a desired wavelength region for face exposure (i.e., imagewise exposure) of at least one photocurable layer to actinic radiation to selectively crosslink and cure portions of the photocurable layer.

The inventors of the present invention investigated the exposure latitude of various photosensitive resin compositions. Based thereon, the inventors of the present invention experimented with various ingredients in the photocurable composition to try to improve the exposure latitude of the photocurable composition.

Figure 1:
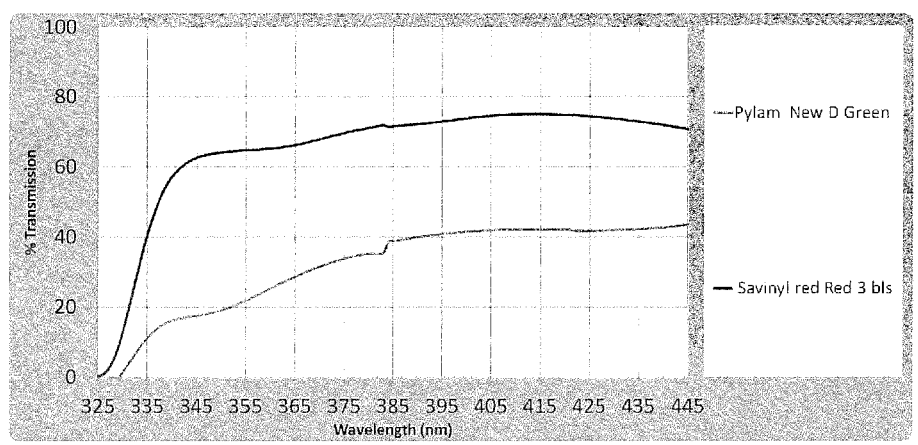
FIG. 1 depicts UV-Vis plots for Pylam Green and Savinyl Red dyes.

The inventors discovered that choosing particular dyes for use in the photocurable composition (such as switching from Savinyl Red dye to Pylam green dye) resulted in a much wider exposure latitude. Initially, it was believed that the improvement latitude could be due to the actual color of the dye, so a number of green dyes were evaluated. However, the results did not correlate specifically to green dyes and thus UV-Vis plots were measured for both the Savinyl Red and Pylam green dyes as shown in FIG. 1.

The UV-Vis spectra of these two dyes displayed a different percent transmission at the 395 nm wavelength (i.e. the peak wavelength used to imagewise expose the photopolymer layer) While Savinyl red was recorded to have 73.0% transmission at 395 nm, the Pylam green dye had only 40.9% transmission at 395 nm. As the 395 nm wavelength does not contribute to the "green" color, a series of dyes was analyzed for their UV-Vis spectra.

Each dye was made up at a concentration of $2.0 \times 10^{-5}$ g/mL and was tested on a Perkin Elmer Lambda 35 UV-Vis spectrophotometer. The procedure of making the solution was to dissolve 0.1 grams of dye in 100 mL of acetone solvent. The solution was then further diluted by mixing 2.0 mL of this solution in 100 mL of additional acetone solvent. The results are presented in Table 1 which shows the absorbance, percent transmission and percent absorption for each of the dyes at 365 nm and at 395 nm.

The inventors found that various dyes yield favorable results when used in relief image printing plate formulations cured with a 395 nm LED array. It was determined that the actual color of the dye did not matter nearly as much as how the dye absorbed in the 395 nm region. Furthermore, it is noted that while the present invention is described as it relates to the absorption/transmission of dyes in a particular wavelength region, the invention is not limited to dyes. That is, any material that absorbs/transmits at the desired level within the chosen wavelength region (including, for example, 395 nm) would be usable in the present invention.

The lower transmitting dyes at 395 nm were made into flexographic printing elements and were exposed with a 395 nm LED array at two exposure levels. Cross sections of the reverses of the imaged and exposed printing elements were then studied.

It was observed that the dyes with a percent transmission of less than 50% started to show an image latitude advantage when curing with 395 nm LEDs and that dyes with a percent transmission of less than 80% showed the greatest imaging latitude. The dye concentration in the formulation showed a formulation at a concentration as low as 0.01% and as high as 0.1% by weight, preferably between about 0.02% and about 0.05% by weight. Dyes made at a concentration of $2 \times 10^{-5}$ g/mL that transmit at less than 20% on a UV spectrophotometer were found to offer excellent imaging latitude when made into a flexographic printing element formulation at 0.02% when curing with a 395 nm LED array.

TABLE 1

Absorbance, % Transmission and % Absorption for selected dyes

| Dye | Absorbance | | % Transmission | | % Absorption | |
|---|---|---|---|---|---|---|
| | 365 | 395 | 365 | 395 | 365 | 395 |
| Violets | | | | | | |
| Pylakrome Violet | 0.137 | 0.092 | 72.930 | 80.930 | 27.070 | 19.070 |
| Baso Violet 618 | 0.434 | 0.078 | 36.850 | 83.540 | 63.150 | 16.460 |
| Flexo Violet 615 | 0.130 | 0.050 | 74.100 | 89.080 | 25.900 | 10.920 |
| HS 400 Violet R | 0.115 | 0.060 | 76.720 | 87.030 | 23.280 | 12.970 |
| LX 1926 Polykrome Violet | 0.153 | 0.096 | 70.340 | 80.180 | 29.660 | 19.820 |
| Methyl Violet Base FN | 0.172 | 0.071 | 67.330 | 84.950 | 32.670 | 15.050 |
| Methyl Violet Base | 0.123 | 0.058 | 75.260 | 87.440 | 24.740 | 12.560 |
| Orasol Violet RN | 0.317 | 0.231 | 48.240 | 58.740 | 51.760 | 41.260 |
| Pylam Krome Violet | 0.137 | 0.092 | 72.930 | 80.930 | 27.070 | 19.070 |
| Sandoplast HS 400 | 0.121 | 0.063 | 75.620 | 86.400 | 24.380 | 13.600 |
| Savinyl Dark Violet R | 0.341 | 0.274 | 45.630 | 53.270 | 54.370 | 46.730 |
| Zapon Violet 500 | 0.043 | 0.040 | 90.470 | 91.250 | 9.530 | 8.750 |
| Waxoline Rubin TR | 0.415 | 0.071 | 38.430 | 84.970 | 61.570 | 15.030 |
| Blues | | | | | | |
| Solvent Blue 67 | 0.583 | 0.155 | 26.140 | 69.920 | 73.860 | 30.080 |
| Polycent Blue RLS | 0.131 | 0.106 | 73.980 | 78.420 | 26.020 | 21.580 |
| Pylam new Royal blue | 0.388 | 0.142 | 40.910 | 72.120 | 59.090 | 27.880 |
| Basic Blue 47 | 0.110 | 0.096 | 77.620 | 80.230 | 22.380 | 19.770 |
| Hecto Blue | 0.386 | 0.265 | 41.100 | 54.350 | 58.900 | 45.650 |
| HS 500 Blue B | 0.269 | 0.165 | 53.880 | 68.380 | 46.120 | 31.620 |
| LX 9544 Pylam Cyan | 0.588 | 0.173 | 25.820 | 67.170 | 74.180 | 32.830 |
| Microlith Blue 4 GK | 0.581 | 0.212 | 26.230 | 61.430 | 73.770 | 38.570 |
| Microlith Blue A3 RK | 0.167 | 0.093 | 68.020 | 80.640 | 31.980 | 19.360 |
| Orasol Blue GL | 0.560 | 0.149 | 27.560 | 70.980 | 72.440 | 29.020 |
| Orasol Blue GN | 0.625 | 0.163 | 23.730 | 68.700 | 76.270 | 31.300 |
| Phthalo Blue LX 10394 | 0.583 | 0.173 | 26.150 | 67.220 | 73.850 | 32.780 |
| Pylakrome Bright Blue | 0.068 | 0.056 | 85.510 | 87.950 | 14.490 | 12.050 |
| Phthalo Blue 405911 | 0.506 | 0.142 | 31.190 | 72.060 | 68.810 | 27.940 |
| Phthalo Blue 405912 | 0.277 | 0.094 | 52.860 | 80.630 | 47.140 | 19.370 |
| Savinyl Blue RLS | 0.134 | 0.105 | 73.520 | 78.580 | 26.480 | 21.420 |
| Solvent Blue 67 | 0.583 | 0.155 | 26.140 | 69.920 | 73.860 | 30.080 |
| Victoria Pure Blue | 0.315 | 0.143 | 48.380 | 71.990 | 51.620 | 28.010 |
| Greens | | | | | | |
| Pylam New D Green | 0.541 | 0.388 | 28.770 | 40.940 | 71.230 | 59.060 |
| Acid Green 25 | 0.177 | 0.255 | 66.520 | 55.620 | 33.480 | 44.380 |
| Lissamine Green | 0.173 | 0.217 | 67.100 | 60.710 | 32.900 | 39.290 |
| Macroflex Green | 0.164 | 0.255 | 68.550 | 55.560 | 31.450 | 44.440 |
| Methylene Green | 0.210 | 0.166 | 61.590 | 68.220 | 38.410 | 31.780 |
| Naphtoluene Green | 0.299 | 0.207 | 50.180 | 62.090 | 49.820 | 37.910 |
| Pylam Old Dark Green | 0.519 | 0.422 | 30.260 | 37.880 | 69.740 | 62.120 |
| Sandoplast Green 2GS | 0.247 | 0.342 | 56.580 | 45.530 | 43.420 | 54.470 |
| Savinyl Green 2GLS | 0.521 | 0.228 | 30.110 | 59.150 | 69.890 | 40.850 |
| Savinyl Green GLS | 0.496 | 0.229 | 31.910 | 59.00 | 68.090 | 41.000 |
| Waxoline Green 5G FW | 0.139 | 0.209 | 72.560 | 61.760 | 27.440 | 38.240 |
| Waxoline Green 6 GFW | 0.142 | 0.221 | 72.060 | 60.170 | 27.940 | 39.830 |
| Waxoline Green GFW | 0.227 | 0.310 | 59.240 | 48.990 | 40.760 | 51.010 |
| Yellows | | | | | | |
| Orasol Yellow 4GN | 0.139 | 0.467 | 72.620 | 34.130 | 27.380 | 65.870 |
| Morton Yellow | 0.534 | 0.792 | 29.250 | 16.140 | 70.750 | 83.860 |
| Neptune Yellow 078 | 0.130 | 0.473 | 74.170 | 33.680 | 25.830 | 66.320 |
| Orasol Orange G | 0.555 | 0.643 | 27.890 | 22.740 | 72.110 | 77.260 |
| Orasol Yellow 2 GLN | 0.384 | 0.564 | 41.270 | 27.290 | 58.730 | 72.710 |
| Orasol Yellow 2 RLN | 0.256 | 0.255 | 55.510 | 55.540 | 44.490 | 44.460 |
| Orasol Yellow 3 R | 0.461 | 0.710 | 34.570 | 19.490 | 65.430 | 80.510 |
| Orasol Yellow 152 | 0.422 | 0.622 | 37.840 | 23.870 | 62.160 | 76.130 |
| Solvent Yellow 83 | 0.424 | 0.609 | 37.660 | 24.610 | 62.340 | 75.390 |

TABLE 1-continued

Absorbance, % Transmission and % Absorption for selected dyes

| Dye | Absorbance | | % Transmission | | % Absorption | |
|---|---|---|---|---|---|---|
| | 365 | 395 | 365 | 395 | 365 | 395 |
| Reds | | | | | | |
| Savinyl Red 3 BLS | 0.179 | 0.136 | 66.250 | 73.030 | 33.750 | 26.970 |
| LX 1903 Pylakrome Red | 0.827 | 0.636 | 14.910 | 23.140 | 85.090 | 76.860 |
| LX 5988 Pylakrome Bright Red | 0.763 | 0.612 | 17.270 | 24.430 | 82.730 | 75.570 |
| LX 10096 Pylakrome Red | 0.057 | 0.068 | 87.620 | 85.580 | 12.380 | 14.420 |
| Moreplas Red 46 | 0.065 | 0.070 | 86.190 | 85.120 | 13.810 | 14.880 |
| Moreplas Red III | 0.064 | 0.084 | 86.360 | 82.320 | 13.640 | 17.680 |
| Neozapon Red 355 | 0.408 | 0.519 | 39.040 | 30.250 | 60.960 | 69.750 |
| Neozapon Red 365 | 0.323 | 0.353 | 47.510 | 44.340 | 52.490 | 55.660 |
| Neozapon Red 471 | 0.305 | 0.219 | 49.560 | 60.440 | 50.440 | 39.560 |
| Neozapon Rot 335 | 0.540 | 0.538 | 28.820 | 29.000 | 71.180 | 71.00 |
| Neozapon Rot 395 | 0.574 | 0.498 | 26.640 | 31.790 | 73.360 | 68.210 |
| Orasol Red 3 GL | 0.429 | 0.309 | 37.280 | 49.110 | 62.720 | 50.890 |
| Orasol Red BL | 0.565 | 0.488 | 27.200 | 32.480 | 72.800 | 67.520 |
| Orcosolve Fire Red G | 0.483 | 0.568 | 32.870 | 27.060 | 67.130 | 72.940 |
| Permalex Red MC-91 | 0.402 | 0.268 | 39.660 | 53.980 | 60.340 | 46.020 |
| Savinyl Red 3 GLS | 0.332 | 0.435 | 46.600 | 36.740 | 53.400 | 63.260 |
| Savinyl Rouge 3 BLS | 0.325 | 0.216 | 47.280 | 60.830 | 52.720 | 39.170 |
| Solvaperm Red 2G | 0.592 | 0.208 | 25.570 | 61.880 | 74.430 | 38.120 |
| Waxoline Red MPWF | 0.060 | 0.079 | 87.180 | 83.420 | 12.820 | 16.580 |
| Moreplas Red 240 | 0.793 | 0.582 | 16.090 | 26.170 | 83.910 | 73.830 |

The dyes were sorted in order of percent absorption. Certain dyes were then selected at specific intervals of percent absorption to be tested in a photosensitive printing plate formulation as shown below in Table 2:

TABLE 2

Example Formulation

| | | Weight % |
|---|---|---|
| KX 405 | Styrene-butadiene-styrene copolymer | 67.50 |
| Ricon 183 | Styrene polymer with 1,3-butadiene | 12.29 |
| Pre-Ricon | | 5.78 |
| HDDA | Hexanediol diacrylate | 12.66 |
| TPO | 2,4,6-trimethylbenzoylethoxyphenyl-phosphine oxide | 1.00 |
| Irganox 565 | Antioxidant | 0.25 |
| Ethanox 330 | Antioxidant | 0.25 |
| Pylam New Green | Dye | 0.02 |
| | | 100.00 |

Commercially available LEDs for imagewise exposure of flexographic printing elements are typically available at a wavelength of 395 nm with a UV power between 1-4 W/cm$^2$. Generally speaking, the intensity of the UV LEDs used in accordance with the invention is greater than 100 mW/cm$^2$, preferably greater than 150 mW/cm$^2$, more preferably greater than 200 mW/cm$^2$, measured at the surface of the flexographic printing plate.

As described herein, the photocurable layer(s) can include any of the known elastomeric binders, monomers, photoinitiators, reactive or non-reactive diluents, fillers, processing aids, UV absorbers and dyes. As used herein, the term "photocurable" refers to a composition which undergoes polymerization, cross-linking, or any other curing or hardening reaction in response to actinic radiation with the result that the unexposed portions of the material can be selectively separated and removed from the exposed (cured) portions to form a three-dimensional relief pattern of cured material.

Elastomeric binders are generally known to those skilled in the art, including, for example, styrene-diene block copolymers, ethylene-acrylic acid copolymers, polyethylene oxide-polyvinyl alcohol graft copolymers, natural rubber, polybutadiene, polyisoprene, styrene-butadiene rubber, nitrile-butadiene rubber, butyl rubber, styrene-isoprene rubber, styrene-butadiene-isoprene rubber, polynorbornene rubber, and ethylene-propylene-diene rubber (EPDM), among others.

The elastomeric binder is preferably a thermoplastically elastomeric block copolymer of alkenylaromatics and 1,3-dienes and may be a linear, branched, or radial block copolymer. Suitable examples include triblock copolymers of the A-B-A type, diblock polymers of the A-B type, or copolymers having two or more alternating elastomeric and thermoplastic blocks, e.g., A-B-A-B-A, and combinations of one or more of the foregoing. The total amount of binder in the photocurable layer(s) is typically in the range of about 40% to 90% by weight, based on the total weight of the photocurable composition, more preferably 45% to 75% by weight.

The photocurable composition also comprises at one ethylenically unsaturated compound that is compatible with the elastomeric binder(s). Suitable compounds have at least one ethylenically unsaturated double bond and are polymerizable. These ethylenically unsaturated compounds (also referred to as monomers) include, for example, esters or amides of acrylic acid or of methacrylic acid with mono- or polyfunctional alcohols, amines, amino alcohols or hydroxylethers and hydroxyl esters, esters of fumaric or maleic acid, vinyl ethers, vinyl esters, or allyl compounds, among others. Preferred examples of suitable monomers include butyl acrylate, 2-ethylhexyl acrylate, lauryl acrylate, tetradecyl acrylate, 1,4-butanediol diacrylate, 1,6-hexanediol diacrylate, 1,6-hexanediol dimethacrylate, 1,9-nonanediol diacrylate, trimethylolpropane tri(meth)acrylate, dioctyl fumarate, and N-dodecylmaleimide, and combinations of one or more of the foregoing. The amount of monomer in the photocurable composition is preferably less than about 25% by weight, preferably between about 5% and about 20% by weight, based on the total weight of the photocurable composition.

The photocurable composition also includes a photoinitiator having a favorable absorption profile in the desired LED wavelength region. Suitable photoinitiators having a favorable absorption profile in the 395 nm region, including bis-acyl phosphine oxide (BAPO), 2,4,6-trimethylbenzoylethoxyphenylphosphine oxide (TPO), Irgacure-369 and Irgacure-379, among others. The amount of photoinitiator in the photocurable composition is typically in the range of from about 0.1% to 5% by weight, based on the total weight of the photocurable composition.

The photocurable composition may also optionally contain one or more plasticizers. Examples of suitable plasticizers include modified and unmodified natural oils and natural resins, such as high-boiling paraffinic, naphthenic, or aromatic mineral oils, synthetic oligomers or resins such as oligostyrene, high-boiling esters, oligomeric styrene-butadiene copolymers, oligomeric α-methylstyrene/p-methylstyrene copolymers, liquid oligobutadienes, or liquid oligomeric acrylonitrile-butadiene copolymers or oligomeric ethylene-propylene-diene copolymers, among others. Preference is given to polybutadiene oils, more particularly those having a molecular weight of between 500 and 5000 g/mol, high-boiling aliphatic esters such as, more particularly, esters of alkylmonocarboxylic and dicarboxylic acids, examples being stearates or adipates, and mineral oils. The amount of an optionally present plasticizer is preferably in the range of about 0% to 50% by weight, based upon the total weight of the photocurable composition.

The photocurable composition may also contain various fillers, processing aids, UV absorbers and dyes.

As to the dyes, as described herein, the inventors have found that the use of a specific dye in the photocurable composition produces a photocurable printing element having an improved exposure latitude. More specifically, the present invention contemplates the use of a dye in the photocurable composition having a % transmission of less than about 50% at 395 nm, more preferably a % transmission of less than about 40% at 395 nm and most preferably a transmission of less than about 20% at 395 when running UV-Vis at a dye concentration of $2 \times 10^{-5}$ g/mL. The dye is typically present in the photocurable composition at a concentration of between about 0.005 and 0.1% by weight, more preferably between about 0.01 and 0.05% by weight, based upon the total weight of the photocurable composition.

TABLE 3

Set of Dyes with increasing percent absorption

| Dye | 395 nm % absorption | 395 nm % transmission |
|---|---|---|
| Solvent Blue 67 | 30.1 | 69.9 |
| Savinyl Green 2 GLS | 40.9 | 59.1 |
| Waxolin Green GFW | 51.0 | 49.0 |
| Pylam New D Green | 59.1 | 40.9 |
| Neozapon Rot 335 | 71.0 | 29.0 |
| Orasol Yellow 3R | 80.5 | 19.5 |

Each of the dyes in Table 3 was then made into the example formulation. Each formulation was then made into flexographic printing plates. Then, UV dosing levels of 4J and 8J were conducted on plates of each dye type. The plates were then developed to remove uncured portions of the one or more photocurable layers by processing in Solvit 100 (available from MacDermid Printing Solutions) and then dried. The reverse depths at each dosing level for each dye are shown in Tables 4 and 5 below.

TABLE 4

30 mil reverse depths for each dye at 4J and 8J dosing levels

| Dye | Depth of 30 mil reverse at 4J | Depth of 30 mil reverse at 8J |
|---|---|---|
| Solvent Blue 67 | 6.0 | 1.9 |
| Savinyl Green 2 GLS | 6.9 | 2.8 |
| Waxolin Green GFW | 15.2 | 5.1 |
| Pylam New D Green | 15.7 | 6.1 |
| Neozapon Rot 335 | 18.2 | 7.5 |
| Orasol Yellow 3R | 19.8 | 12.8 |

TABLE 5

15 mil reverse depths for each dye at 4J and 8J dosing levels

| Dye | Depth of 15 mil reverse at 4J | Depth of 15 mil reverse at 8J |
|---|---|---|
| Solvent Blue 67 | 2.6 | 1.0 |
| Savinyl Green 2 GLS | 3.2 | 1.4 |
| Waxolin Green GFW | 5.5 | 2.6 |
| Pylam New D Green | 5.7 | 3.1 |
| Neozapon Rot 335 | 6.4 | 3.3 |
| Orasol Yellow 3R | 8.0 | 4.4 |

Figure 2:
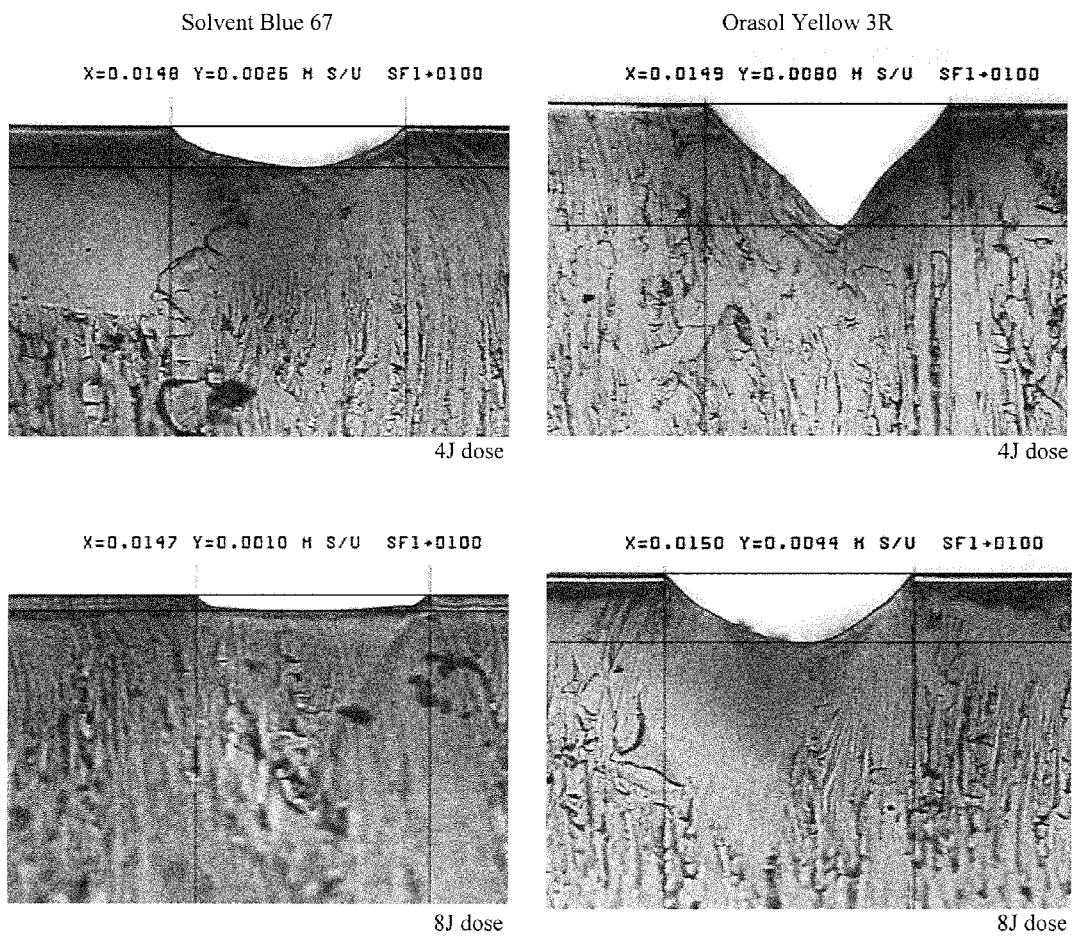
FIG. 2 depicts reverses of 15 mil reverses of dyes having a 30% absorption and an 80% absorption at 4J and 8J.

Thus, dyes having a lower percent transmission at 395 nm yielded deeper reverses. At the same dosing levels, plates made yielded 1% highlight dots at 150 LPI when exposed at 8J dosing levels, meaning that it produced a usable printing element. FIG. 2 shows reverses of 15 mil reverses of dyes having a 30% absorption and an 80% absorption at 4J and 8J. As seen in FIG. 2, the formulation that contains a dye having an 80% absorption demonstrates much deeper reverses than the formulation having a 30% absorption.

It is believed that transmissions of less than 50% at 395 nm are required to see a usable benefit, while a greater benefit is observed with transmissions of less than 41% and the best benefit at transmissions of less than 20% when running UV-Vis at a dye concentration of $2 \times 10^{-5}$ g/mL.

Based on the results provided herein, the preferred dye list (with % Absorption is as follows):

| | | |
|---|---|---|
| 1) | Orasol Red 3GL | (50.9% A) |
| 2) | Waxolin Green GFW | (51.0% A) |
| 3) | Sandoplast Green 2GS | (54.5% A) |
| 4) | Neozapon Red 365 | (55.7% A) |
| 5) | Pylam New D Green | (59.1% A) |
| 6) | Pylam Old Dark Green | (62.1% A) |
| 7) | Savinyl Red 3 GLS | (63.3% A) |
| 8) | Orasol Yellow 4GN | (65.9% A) |
| 9) | Neptune Yellow 078 | (66.3% A) |
| 10) | Orasol Red BL | (67.5% A) |
| 11) | Neozapon Red 395 | (68.2% A) |
| 12) | Neozapon Red 355 | (69.8% A) |
| 13) | Neozapon Red 335 | (71.0% A) |
| 14) | Orasol Yellow 2GLN | (72.7% A) |
| 15) | Orcosolve Fire Red G | (72.9% A) |
| 16) | Moreplas Red 240 | (73.8% A) |
| 17) | Solvent Yellow 83 | (75.4% A) |
| 18) | Pylakrome Bright Red LX 5988 | (75.6% A) |
| 19) | Orasol Yellow 152 | (76.1% A) |
| 20) | Pylakrome Red LX 1903 | (76.9% A) |
| 21) | Orasol Orange G | (77.3% A) |
| 22) | Orasol Yellow 3R | (80.5% A) |
| 23) | Morton Orange | (83.9% A) |

It should further be apparent that one skilled in the art could readily identify dyes other than those listed that would have the desired percent transmission/percent absorption and that would be usable in the photocurable layers described herein.

It should also be understood that the following claims are intended to cover all of the generic and specific features of the invention described herein and all statements of the scope of the invention that as a matter of language might fall therebetween.

What is claimed is:

1. A method of making a photosensitive relief image printing element from a photosensitive printing blank, wherein the photosensitive printing blank comprises a support, at least one photocurable layer upon the support, wherein the at least one photocurable layer is capable of being selectively crosslinked and cured upon exposure to actinic radiation at a selected wavelength and wherein the at least one photocurable layer comprises (a) at least one elastomeric binder, (b) at least one ethylenically unsaturated monomer, (c) a photoinitiator having a favorable absorption profile in the desired wavelength region used for exposing the at least one photocurable layer to actinic radiation, and (d) a dye, wherein the dye exhibits the characteristic of measuring less than 50 percent transmittance, at the peak wavelength of the actinic radiation used to cure the photocurable layer, when measured in a U.V. spectrometer at a concentration of $2 \times 10^{-5}$ gr/ml; and optionally an infrared ablatable layer disposed on the at least one photocurable layer; the method of comprising the steps of:
   a) imagewise exposing the at least one photocurable layer to actinic radiation at the selected wavelength to selectively cross link and cure the at least one photocurable layer; and
   b) developing the at least one photocurable layer to remove uncured portions of the at least one photocurable layer;
   wherein the presence of the dye results in a relief image in the printing element having an improved exposure latitude.

2. The method according to claim 1, wherein the at least one photocurable layer is exposed to actinic radiation using a light emitting diode operating at the selected wavelength.

3. The method according to claim 2, wherein the selected wavelength is 395 nm.

4. The method according to claim 3, wherein the dye exhibits a percent transmission of less than about 50% at 395 nm wavelength.

5. The method according to claim 4, wherein the dye exhibits a percent transmission of less than about 40% at 395 nm wavelength.

6. The method according to claim 5, wherein the dye exhibits a percent transmission of less than about 20% at 395 nm wavelength.

7. The method according to claim 1, wherein the dye is present in the at least one photocurable layer at a concentration of between about 0.01 and 0.1 percent by weight.

8. The method according to claim 7, wherein the dye is present in the at least one photocurable layer at a concentration of between about 0.02 and 0.05 percent by weight.

9. The method according to claim 3, wherein the light emitting diode comprises an array of light emitting diodes and the intensity of each light emitting diode in the array is greater than 100 mW/cm$^2$.

* * * * *